(12) United States Patent
Jin

(10) Patent No.: US 11,769,672 B2
(45) Date of Patent: Sep. 26, 2023

(54) SEMICONDUCTOR STRUCTURE AND FORMING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Jisong Jin, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 160 days.

(21) Appl. No.: 17/218,886

(22) Filed: Mar. 31, 2021

(65) Prior Publication Data

US 2022/0115242 A1  Apr. 14, 2022

(30) Foreign Application Priority Data

Oct. 14, 2020  (CN) .......................... 202011094544.0

(51) Int. Cl.
*H01L 21/311* (2006.01)
*H01L 21/768* (2006.01)
*H01L 21/3115* (2006.01)

(52) U.S. Cl.
CPC .. *H01L 21/31144* (2013.01); *H01L 21/76816* (2013.01); *H01L 21/31155* (2013.01)

(58) Field of Classification Search
CPC ......... H01L 21/31144; H01L 21/76816; H01L 21/31155
See application file for complete search history.

(56) References Cited

U.S. PATENT DOCUMENTS

2019/0318928 A1* 10/2019 Mignot ............ H01L 21/76816

* cited by examiner

*Primary Examiner* — Monica D Harrison
*Assistant Examiner* — Andre C Stevenson
(74) *Attorney, Agent, or Firm* — Crowell & Moring, L.L.P.

(57) ABSTRACT

A semiconductor structure and a forming method thereof are provided. In one form, a forming method includes: forming separated mandrel lines, where opposite sidewalls of adjacent mandrel lines in a second direction are a first sidewall and a second sidewall; forming a sacrificial spacer on a sidewall of the mandrel line; forming a sacrificial layer on a part of the base between adjacent sacrificial spacers; forming a filling layer on the base; removing the sacrificial layer to form an opening; removing the sacrificial spacer to form a trench; forming a mask spacer on a sidewall of the trench, where the mask spacer is further filled between the sidewall of the mandrel line and the filling layer, and the mask spacer located on the sidewall of the trench forms a first groove; forming a second groove running through the filling layer between the sidewall of the trench and the mask spacer located on the second sidewall; removing the mandrel line to form a third groove, where a cutting layer is formed in at least one of the third groove, the second groove, and the first groove, and the cutting layer cuts the corresponding groove along the first direction; and patterning a target layer below the third groove, the second groove, and the first groove to form a target pattern. The embodiments in the present disclosure improve the pattern precision of the target pattern.

18 Claims, 10 Drawing Sheets

SEMICONDUCTOR STRUCTURE AND FORMING METHOD THEREOF

RELATED APPLICATIONS

The present application claims priority to Chinese Patent Appln. No. 202011094544.0, filed Oct. 14, 2020, the entire disclosure of which is hereby incorporated by reference.

BACKGROUND

Technical Field

Embodiments and implementations of the present disclosure relate to the field of semiconductor manufacturing, and in particular, to a semiconductor structure and a forming method thereof.

Related Art

With the rapid growth of the semiconductor integrated circuit (IC) industry, semiconductor technologies are continuously developed toward smaller process nodes as driven by Moore's Law. ICs are accordingly developed toward a direction of smaller size, higher circuit precision, and higher circuit complexity.

In the development process of the ICs, generally, as a functional density (that is, a quantity of interconnected structures per chip) gradually increases, the geometric dimension (that is, the smallest component dimension that can be produced by using process steps) gradually decreases, which accordingly increases the difficulty and complexity in manufacturing the ICs.

Currently, as technological nodes become increasingly small, it is challenging to enable a pattern formed on a wafer to better match a target pattern.

SUMMARY

To address the foregoing problem, embodiments and implementations of the present disclosure provide a semiconductor structure and a forming method thereof, to improve the flexibility and freedom of layout design of a target pattern.

One form the present disclosure provides a forming method of a semiconductor structure. A form of a method for forming a semiconductor structure includes: providing a base, including a target layer configured to form a target pattern; forming mandrel lines that extend along a first direction and are arranged at intervals along a second direction on the base, where the second direction is perpendicular to the first direction, and opposite sidewalls of adjacent mandrel lines in the second direction are a first sidewall and a second sidewall; forming a sacrificial spacer on a sidewall of the mandrel line; forming a sacrificial layer extending along the first direction on a part of the base between adjacent sacrificial spacers, where the sacrificial layer covers a sidewall of a sacrificial spacer located on the first sidewall, and is spaced apart from a sacrificial spacer located on the second sidewall; forming a filling layer on the base exposed by the mandrel line, the sacrificial spacer, and the sacrificial layer; removing the sacrificial layer, to form an opening in the filling layer; removing the sacrificial spacer, where the opening and the first sidewall form a trench; forming a mask spacer on a sidewall of the trench, where the mask spacer is further filled between the sidewall of the mandrel line and the filling layer, and the mask spacer located on the sidewall of the trench forms a first groove; forming a second groove running through the filling layer between the sidewall of the trench and the mask spacer located on the second sidewall; and removing the mandrel line, to form a third groove, where a cutting layer is formed in at least one of the third groove, the second groove, and the first groove, and the cutting layer cuts the corresponding groove along the first direction; and patterning the target layer below the third groove, the second groove, and the first groove by using the cutting layer, the mask spacer, and the filling layer as a mask, to form the target pattern.

The present disclosure further provides a semiconductor structure. In one form, a semiconductor structure includes: a base, including a target layer configured to form a target pattern; mandrel lines, located on the base, where the mandrel lines extend along a first direction and are arranged at intervals along a second direction, the second direction is perpendicular to the first direction, and opposite sidewalls of adjacent mandrel lines in the second direction are a first sidewall and a second sidewall; a filling layer, located on the base exposed by the mandrel lines, where a trench running through a part of the filling layer is formed between adjacent mandrel lines in the second direction, and the trench exposes the first sidewall and is spaced apart from the second sidewall; a mask spacer, located on a sidewall of the trench and between a sidewall of the mandrel line and the filling layer, where the mask spacer located on the sidewall of the trench forms a first groove; a second groove, running though the filling layer between the first groove and the mask spacer located on the second sidewall, where the mandrel line is configured to occupy space for forming a third groove; and a cutting layer, running through at least one of the mandrel line, the second groove, and the first groove along the second direction, where the cutting layer is configured to cut the corresponding groove along the first direction.

Compared with existing technologies, at least the following technical solutions of embodiments and implementations of the present disclosure have the following advantages.

In implementations of a forming method of a semiconductor structure according to the present disclosure, a shape and position of the first groove are defined using the sacrificial layer and the mask spacer, a shape and position of the second groove are defined using the mandrel line, and the second groove is formed in different steps, which is conductive to reducing the difficulty in forming the first groove, the second groove, and the third groove, improving a process window (for example, mitigating the optical proximity effect, and relieving the limitation to the resolution of the photolithography process), and improving the accuracy of pattern transfer, so as to ensure the pattern precision of the first groove, the second groove, and the third groove. A cutting layer is formed in at least one of the third groove, the second groove, and the first groove, and the cutting layer cuts the corresponding groove along the first direction, so that a smaller distance can be achieved between grooves located on two sides of the cutting layer. Accordingly, after the target layer below the third groove, the second groove, and the first groove is patterned and the target pattern is formed, a smaller distance can also be achieved between adjacent parts of the target pattern at a head-to-head (HTH) position, which is conductive to improving the flexibility and freedom of layout design of the target pattern, and meeting a requirement for a decreasing pitch in an IC.

DETAILED DESCRIPTION

Figure 1:
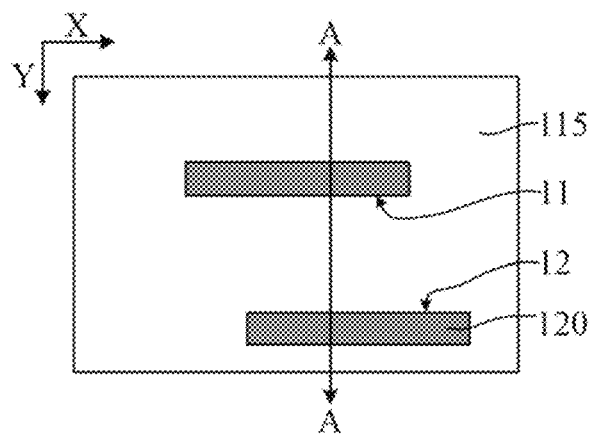
FIG. 1 to FIG. 32 are schematic structural diagrams corresponding to steps in one form of a forming method of a semiconductor structure according to the present disclosure.

As can be seen from the related art, it is challenging to enable a pattern formed on a wafer to better match a target pattern. Specifically, in a current back end of line (BEOL), the patterning process of a metal interconnect line is quite difficult and has a small process window.

For example, when a pattern of an interconnect pattern is relatively complex, the photolithography process requires a large number of masks, which not only leads to high process costs, but also leads to great difficulty in optical proximity correction processing of the masks due to complex mask patterns, resulting in low pattern precision and poor pattern quality of a formed interconnect line and even a problem that an interconnect line is bridged at a position where a connection is not needed.

In a method, dummy lines are used to improve a process window of the photolithography process and reduce the complexity of a mask pattern. During operation of a device, these dummy lines are in a floating state, that is, these dummy lines are not electrically connected to an external circuit or another interconnect structure. However, these floating dummy lines are likely to increase parasitic capacitance between interconnect structures in the BEOL, resulting in inadequate performance of a formed semiconductor structure. A device currently formed still has the problem of inadequate performance.

To address the foregoing technical problems, in a forming method of a semiconductor structure according to embodiments and implementations of the present disclosure, a shape and position of a first groove are defined using a sacrificial layer and a mask spacer, where a shape and position of a second groove are defined by using a mandrel line, and the second groove is formed in different steps, which is conductive to reducing the difficulty in forming the first groove, the second groove, and a third groove, thereby improving a process window (for example, mitigating the optical proximity effect, and relieving the limitation to the resolution of the photolithography process), and improving the accuracy of pattern transfer, so as to ensure the pattern precision of the first groove, the second groove, and the third groove. A cutting layer is formed in at least one of the third groove, the second groove, or the first groove, and the cutting layer cuts the corresponding groove along a first direction, so that a smaller distance can be achieved between corresponding grooves located on two sides of the cutting layer. Accordingly, after a target layer below the third groove, the second groove, and the first groove is patterned and the target pattern is formed, a smaller distance can also be achieved between adjacent parts of the target pattern at an HTH position, which is conductive to improving the flexibility and freedom of layout design of the target pattern, and meeting a requirement for a decreasing pitch in an IC.

To make the foregoing objectives, features, and advantages of the embodiments of the present disclosure more clearly understood, specific embodiments and implementations of the present disclosure are described in detail below with reference to the accompanying drawings.

FIG. 1 to FIG. 32 are schematic structural diagrams corresponding to steps in one form of a forming method of a semiconductor structure according to the present disclosure.

Figure 2:
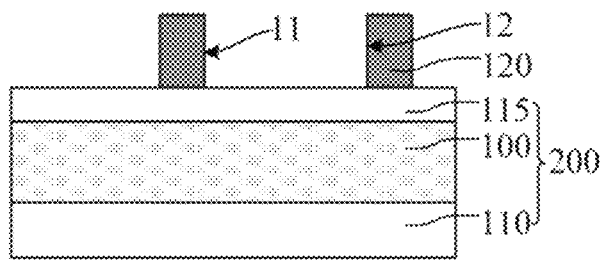

Refer to FIG. 1 and FIG. 2, FIG. 2 is a cross-sectional view along a cutting line A-A in FIG. 1. A base 200 is provided, including a target layer 100 configured to form a target pattern.

The base 200 is configured to provide a platform for a subsequent manufacturing process. The target layer 100 is a film layer to be patterned to form the target pattern. The target pattern may be a pattern such as a gate structure, an interconnect trench in a BEOL, a fin in a fin field effect transistor (FinFET), a channel stack in a gate-all-around (GAA) transistor or a Forksheet transistor, or a hard mask (HM) layer.

In this form, the target layer 100 is a dielectric layer. Subsequently, the dielectric layer is patterned to form a plurality of interconnect trenches in the dielectric layer, and then interconnect lines are formed in the interconnect trenches. The dielectric layer is configured to implement electrical isolation between adjacent interconnect lines. Accordingly, the target pattern is an interconnect trench. The dielectric layer is accordingly an inter metal dielectric (IMD) layer. A material of the dielectric layer is a low-k dielectric material, an ultra-low-k dielectric material, silicon oxide, silicon nitride, silicon oxynitride, or the like.

In this form, semiconductor devices such as a transistor and a capacitor may be formed in the base 200, and functional structures such as a resistance structure and a conductive structure may also be formed in the base 200. In this form, the base 200 further includes a substrate 110 located below the target layer 100. In an example, the substrate 110 is a silicon substrate.

In this form, the base 200 further includes an HM material layer 115 above the target layer 100. Subsequently, the HM material layer 115 is patterned first to form an HM layer, and the target layer 100 is then patterned using the HM layer as a mask, which is conductive to improving the process stability of patterning the target layer 100 and the accuracy of pattern transfer.

A material of the HM material layer 115 includes at least one of titanium nitride, tungsten carbide, silicon oxide, silicon oxycarbide, or silicon oxycarbonitride. In an example, the material of the HM material layer 115 is titanium nitride.

In a specific process, a stress buffer layer can further be disposed between the HM material layer 115 and the target layer 100 according to an actual process requirement, to improve adhesiveness between the HM material layer 115 and the target layer 100, and reduce stress generated between film layers. In addition, an etch stop layer can further be disposed between the HM material layer 115 and the stress buffer layer and on the HM material layer 115, to define a stop position of etching during a subsequent etching process, which is conductive to improving an effect of a subsequent patterning process. For the related description of the stress buffer layer and the etch stop layer, details are not described in this form.

Still referring to FIG. 1 and FIG. 2, mandrel lines 120 that extend along a first direction (an X direction shown in FIG. 1) and that are arranged at intervals along a second direction (a Y direction shown in FIG. 1) are formed on the base 200, the second direction is perpendicular to the first direction, and opposite sidewalls of adjacent mandrel lines 120 in the second direction are a first sidewall 11 and a second sidewall 12.

In this form, the mandrel line 120 is configured to occupy space for forming a third groove and define a shape and position of the third groove. Different from the practice of directly forming the third groove using an etching process, in this form, the third groove is formed by forming the mandrel line 120 first to occupy space for the third groove, and then removing the mandrel line 120, which is conductive to reducing the difficulty in forming the third groove, improving a process window for forming the third groove, and ensuring the pattern precision of the third groove. Accordingly, the pattern precision of the target pattern formed subsequently by etching the target layer 100 below the third groove is improved. The mandrel line 120 also provides support for forming a sacrificial spacer subsequently.

In this form, the mandrel line 120 is made of a material that can be easily removed, thereby reducing the difficulty in a subsequent process of removing the mandrel line 120. The mandrel line 120 is a single-layer structure or a multi-layer structure. The material of the mandrel line 120 includes at least one of amorphous silicon, polysilicon, silicon oxide, amorphous carbon, silicon nitride, amorphous germanium, silicon oxynitride, carbon nitride, silicon carbide, silicon carbonitride, or silicon oxycarbonitride.

In an example, the mandrel line 120 is a single-layer structure and the material of the mandrel line 120 is amorphous silicon.

Figure 3:
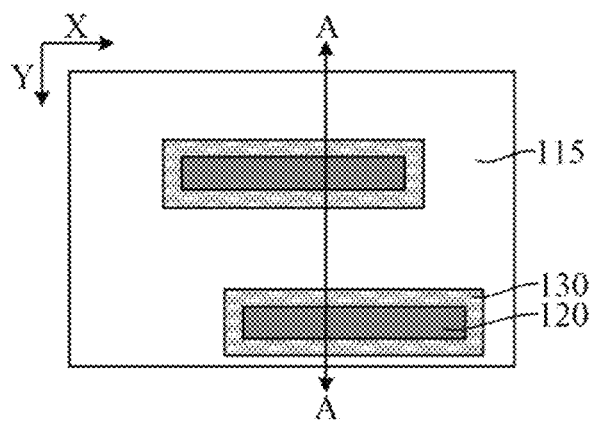
Figure 4:
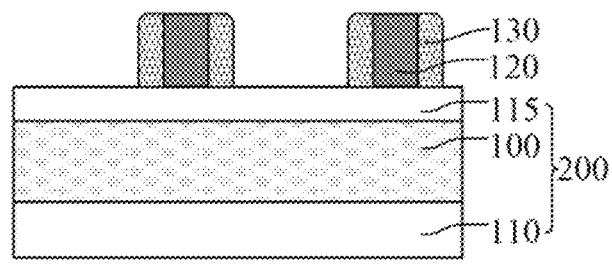

Referring to FIG. 3 and FIG. 4, FIG. 4 is a cross-sectional view along a cutting line A-A in FIG. 3. A sacrificial spacer 130 is formed on a sidewall of the mandrel line 120.

The sacrificial spacer 130 is configured to occupy space for forming a mask spacer subsequently. The thickness of the sacrificial spacer 130 further defines a subsequent spacing between the adjacent third groove and second groove. In this form, by adjusting the thickness of the sacrificial spacer 130, a designed minimum spacing can be easily met between the adjacent third groove and second groove.

In this form, the mandrel line 120 is first formed, and then the sacrificial spacer 130 is formed on the sidewall of the mandrel line 120. The sacrificial spacer 130 is an outer spacer. After the third groove is formed by removing the mandrel line 120, a distance between adjacent third grooves along the first direction is defined by the mandrel line 120. Different from the practice of forming a groove first and then forming an inner spacer on a sidewall of the groove, in this form, the distance between the adjacent third grooves along the first direction is not a sum of a distance between adjacent mandrel lines and two times of the thickness of the inner spacer, which is conductive to achieving a smaller distance between the adjacent third grooves along the first direction. Accordingly, after the target layer below the third groove is patterned and the target pattern is formed, a smaller distance can be achieved between adjacent parts of the target pattern at an HTH position, which is conductive to improving the flexibility and freedom of layout design of the target pattern and reducing process costs.

The sacrificial spacer 130 is made of a material that have etch selectivity with the mandrel line 120 and the target layer 100. The material of the sacrificial spacer 130 includes at least one of titanium oxide, silicon oxide, silicon nitride, silicon carbide, silicon oxycarbide, or amorphous silicon. In some implementations, the material of the sacrificial spacer 130 is silicon nitride.

In this form, a process of forming the sacrificial spacer 130 includes an atomic layer deposition process, which is conductive to improving the thickness uniformity of the sacrificial spacer 130, and makes it easy to precisely control the thickness of the sacrificial spacer 130.

Figure 5:
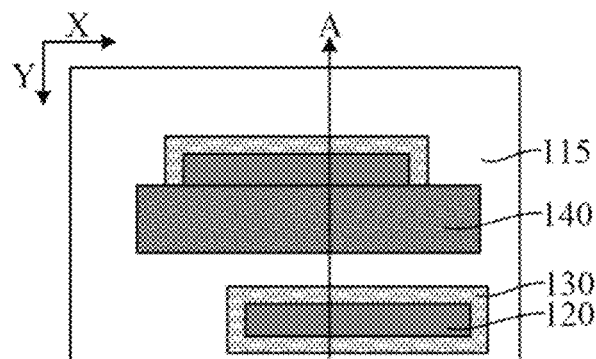
Figure 6:
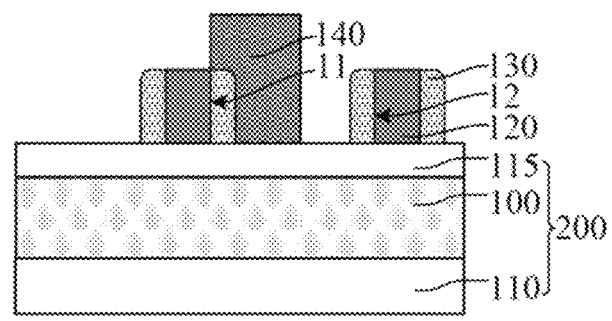

Refer to FIG. 5 and FIG. 6. FIG. 6 is a cross-sectional view along a cutting line A-A in FIG. 5. A sacrificial layer 140 extending along a first direction (an X direction shown in FIG. 5) is formed on a part of the base 200 between adjacent sacrificial spacers 130. The sacrificial layer 140 covers a sidewall of a sacrificial spacer 130 located on the first sidewall 11, and is spaced apart from a sacrificial spacer 130 located on the second sidewall 12.

The sacrificial layer 140 is configured to occupy space for forming an opening. Subsequently, a filling layer is formed on the base 200 exposed by the mandrel line 120, the sacrificial spacer 130, and the sacrificial layer 140, and the sacrificial spacer 130 is removed so that the opening and the first sidewall 11 to form a trench. The trench provides support for forming a mask spacer subsequently, so that mask spacers in the trench can form a first groove. Therefore, in this form, a shape and position of the first groove are defined using the sacrificial layer 140 and the mask spacer.

Different from the practice of directly defining the shape and position of the first groove using an etching process or a single film layer, in this form, the shape and position of the first groove are defined using the sacrificial layer 140 and the mask spacer, and in the step of forming the sacrificial layer 140, a key dimension of the sacrificial layer 140 is greater than a key dimension of the subsequently formed first groove (for example, dimensions along the first direction and the second direction), which is conductive to reducing the difficulty in the process of forming the sacrificial layer 140 and lowering a requirement on process precision of forming the sacrificial layer 140, for example, reducing the photolithography process difficulty in forming the sacrificial layer 140, and improving a photolithography process tolerance in forming the sacrificial layer 140, so as to achieve high pattern quality and pattern precision of the sacrificial layer 140, and ensure the pattern quality and pattern precision of the subsequently formed first groove.

In this form, the sacrificial layer 140 covers a sidewall of the sacrificial spacer 130 located on the first sidewall 11, and is spaced apart from the sacrificial spacer 130 located on the second sidewall 12. Space between the sacrificial layer 140 and the sacrificial spacer 130 on the second sidewall 12 along the second direction is used for filling in a subsequent filling layer to form a second groove subsequently.

The sacrificial layer 140 is made of a material that has etch selectivity with the mandrel line 120 and the target layer 100. The material of the sacrificial layer 140 includes at least one of an organic planarization material, silicon oxide, or amorphous carbon. The organic planarization material includes a bottom anti-reflective coating (BARC), spin-on carbon (SOC), and the like. In this form, the material of the sacrificial layer 140 is SOC. The SOC has excellent filling performance, and is easy to etch, which is conductive to reducing the difficulty in forming the sacrificial layer 140 and the difficulty in removing the sacrificial layer 140 subsequently.

In this form, a top surface of the sacrificial layer 140 is higher than a top surface of the mandrel line 120. A process of forming the sacrificial layer 140 includes steps of forming a sacrificial material layer covering the sacrificial spacer 130 and the mandrel line 120 and patterning the sacrificial material layer. As the top surface of the sacrificial layer 140 is higher than the top surface of the mandrel line 120, a step of removing a part of the sacrificial material layer higher than the top surface of the mandrel line is saved, which is conductive to reducing the process difficulty in forming the sacrificial layer 140, because it is relatively difficult to remove the part of the sacrificial material layer higher than the top surface of the mandrel line 120.

In this form, the sacrificial layer 140 further covers a top surface of the sacrificial spacer 130 on the first sidewall 11.

Figure 7:
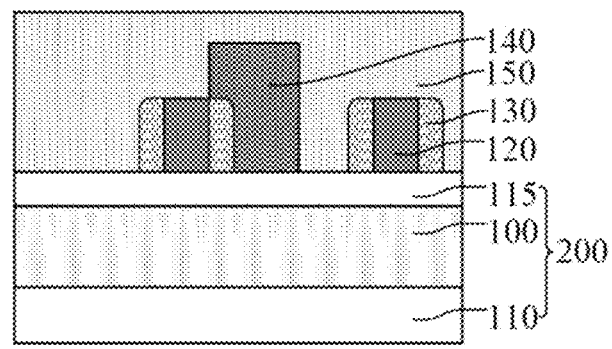
Figure 8:
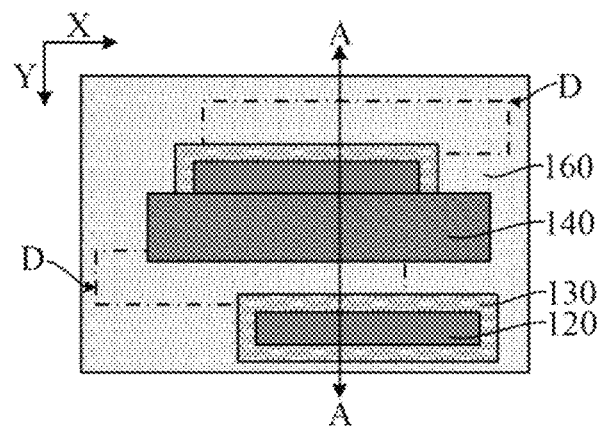
Figure 9:
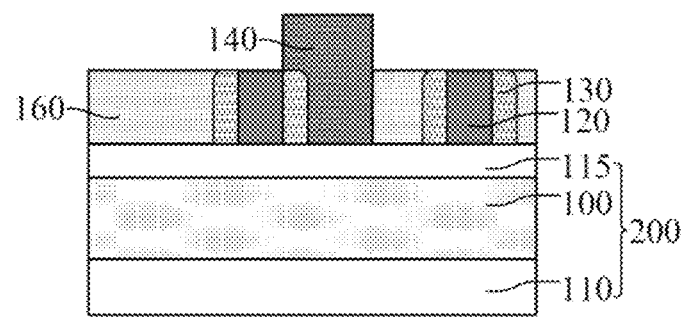

In another form, the top surface of the sacrificial layer may further be flush with the top surface of the mandrel line. Referring to FIG. 7 to FIG. 9, a filling layer 160 is formed on the base 200 exposed by the mandrel line 120, the sacrificial spacer 130, and the sacrificial layer 140.

The filling layer 160 is configured to provide a process basis for forming a second groove subsequently. The filling layer 160 is used together with a subsequent mask spacer and a cutting layer as a mask to pattern the target layer 100. In this form, the filling layer 160 includes a preset area D (shown in FIG. 8) located between a sidewall of the sacrificial layer 140 and the sacrificial spacer 130 located on the second sidewall 12. The preset area D is used for forming the second groove.

The filling layer 160 is made of a material that has etch selectivity with the mandrel line 120, the sacrificial layer 140, and the sacrificial spacer 130. The material of the filling layer 160 includes spin-on silicon oxide, metal oxide (such as titanium oxide), polysilicon, and amorphous silicon. In this form, the material of the filling layer 160 is spin-on silicon oxide. The process of forming the filling layer 160 includes a spin-on process, which is conductive to improving the filling capability and filling quality of the filling layer 160, and improving the flatness of a top surface of the filling layer 160.

In this form, the step of forming the filling layer 160 includes:

FIG. 7 is a cross-sectional view based on FIG. 6. A filling material layer 150 covering the mandrel line 120, the sacrificial layer 140, and the sacrificial spacer 130 is formed on the base 200.

A process of forming the filling material layer 150 includes at least one of an atomic layer deposition process, a chemical vapor deposition process, or a spin-on process. In one form, the filling material layer 150 is formed using the spin-on process. The spin-on process requires simple operation steps and low process costs, and is conductive to improving the flatness of a top surface of the filling material layer 150.

Referring to FIG. 8 and FIG. 9, FIG. 9 is a cross-sectional view along a cutting line A-A in FIG. 8. A part of the filling material layer 150 higher than the top surface of the mandrel line 120 is removed, and the remaining filling material layer 150 is used as the filling layer 160.

In this form, the part of the filling material layer 150 higher than the top surface of the mandrel line 120 is removed using a dry etching process (for example, an anisotropic dry etching process).

Figure 10:
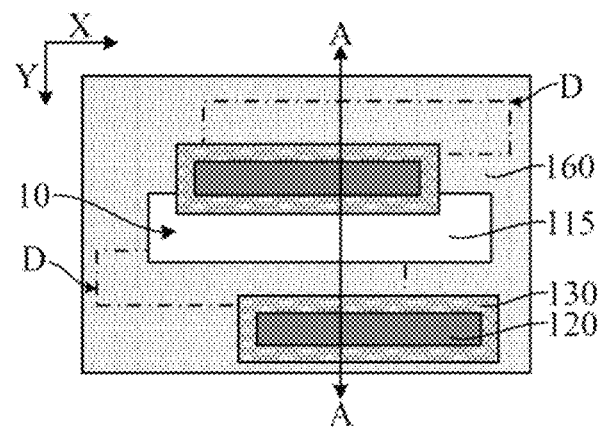
Figure 11:
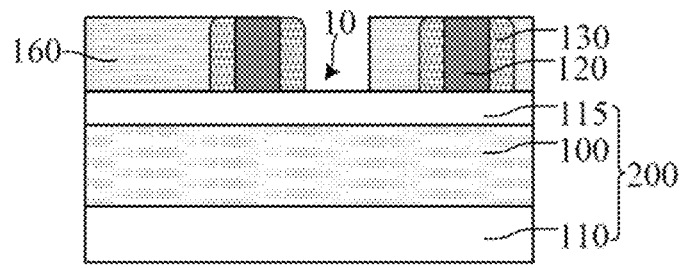

Refer to FIG. 10 and FIG. 11, FIG. 11 is a cross-sectional view along a cutting line A-A in FIG. 10. The sacrificial layer 140 is removed to form an opening 10 in the filling layer 160.

In this form, the forming method further includes removing the sacrificial spacer 130. After the sacrificial spacer 130 is removed, the opening 10 is configured to form a trench together with the first sidewall 11.

In this form, the sacrificial layer 140 further covers the top surface of the sacrificial spacer 130 on the first sidewall 11. Therefore, the sacrificial layer 140 is removed first, to expose the sacrificial spacer 130 located on the first sidewall 11, so as to remove the sacrificial spacer 130. In another form, a sequence of removing the sacrificial layer and removing the sacrificial spacer can further be flexibly adjusted according to an actual process requirement.

A process of removing the sacrificial layer 140 includes one or two processes of wet etching and dry etching. In this form, the sacrificial layer 140 is removed using the dry etching process. Specifically, the material of the sacrificial layer 140 is SOC. The sacrificial layer 140 is removed using an ashing process. In one form, the sacrificial layer 140 is removed by using oxygen plasma. The process of removing the sacrificial layer 140 is not complex, and has less impact on another film layer.

Figure 12:
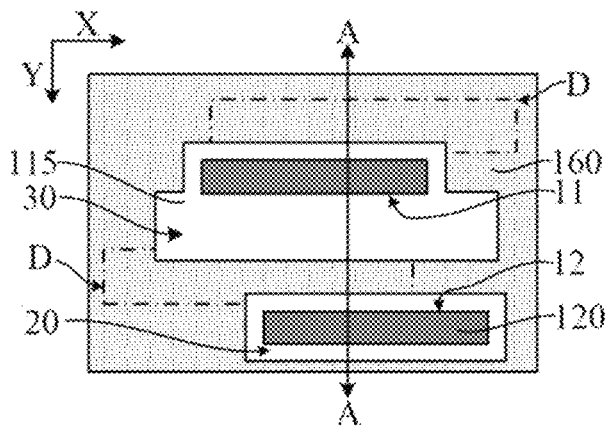
Figure 13:
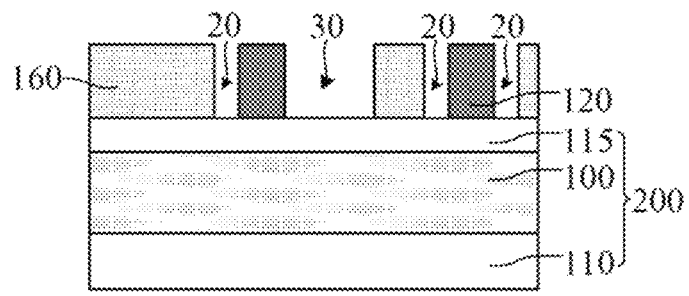

Referring to FIG. 12 and FIG. 13, FIG. 13 is a cross-sectional view along a cutting line A-A in FIG. 12. The sacrificial spacer 130 is removed, where the opening 10 and the first sidewall 11 form a trench 30.

A sidewall of the trench 30 is configured to provide support for forming a mask spacer. Accordingly, the trench 30 and the mask spacer located on the sidewall of the trench 30 are configured to define a shape and position of a first groove.

By removing the sacrificial spacer 130, the first sidewall 11 of the mandrel line 120 is exposed. After the mask spacer is formed on the sidewall of the trench 30 subsequently, the mask spacer located on the sidewall of the trench 30 forms the first groove. A spacing between the first groove and the first sidewall 11 is accordingly the thickness of the mask spacer, and a spacing between the first groove and the third groove is accordingly the thickness of the mask spacer as well, which is conductive to meeting a designed minimum spacing between the first groove and the third groove.

In this form, the sacrificial spacer 130 is removed, to form a gap 20 between the sidewall of the mandrel line 120 and the filling layer 160. The gap 20 is configured to reserve space for forming the mask spacer.

A process of removing the sacrificial spacer 130 includes one or two processes of dry etching and wet etching.

In this form, the sacrificial spacer 130 is removed using the wet etching process. The wet etching process easily achieves relatively high etch selectivity to completely remove the sacrificial spacer 130, and the operation is simple.

Figure 14:
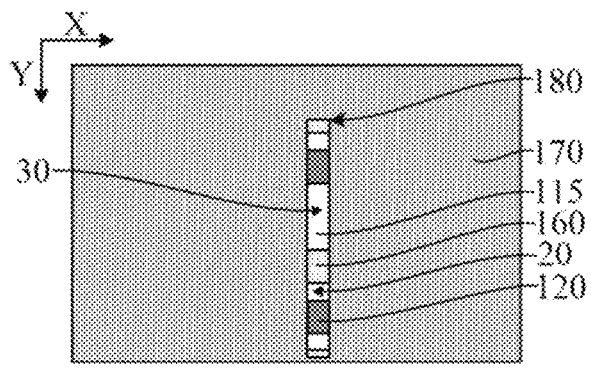
Figure 15:
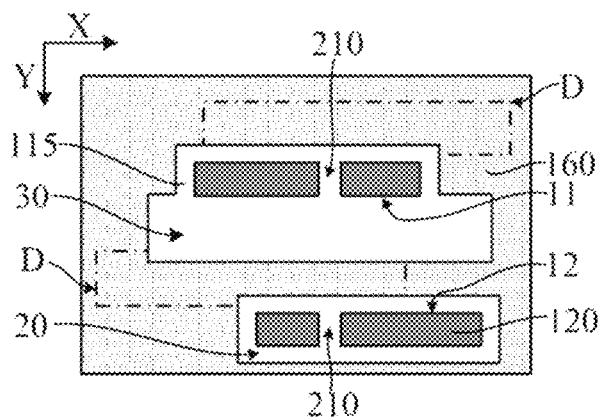

Referring to FIG. 14 and FIG. 15, in this form, the forming method further includes: forming a third blocking groove 210 (shown in FIG. 15) running through the mandrel line 120 along the second direction after the mandrel line 120 is formed.

The third blocking groove 210 is configured to cut the mandrel line 120 along the first direction, so that a smaller distance can be achieved between adjacent mandrel lines 120 along the first direction. The third blocking groove 210 is further configured to provide space for forming a third cutting layer, so that after the third groove is formed by removing the mandrel line 120 subsequently, the third cutting layer cuts the third groove along the first direction.

In one form, the third blocking groove 210 is formed after the sacrificial layer 140 and the sacrificial spacer 130 are removed and before the mask spacer is formed. The third blocking groove 210 is formed before the mask spacer is formed, so that in the subsequent step of forming the mask spacer, the mask spacer can be formed in the third blocking groove 210 as the third cutting layer. Therefore, steps of forming the mask spacer and forming the third cutting layer are integrated accordingly, so that the step of forming the third cutting layer additionally is saved, which is conductive to simplifying processes and improving the process integration.

In another form, according to an actual process requirement, the third cutting layer may alternatively be formed by using another process step.

The specific steps of forming the third blocking groove in this form are described in detail below with reference to the accompanying drawings.

As shown in FIG. 14, a cover layer 170 covering the mandrel line 120 is formed on the filling layer 160. The cover layer 170 is further filled in the gap 20 and the trench 30.

A cutting opening is formed in the cover layer 170 subsequently. The remaining cover layer 170 is used as a mask to etch the mandrel line 120. In this form, a material of the cover layer 170 includes SOC.

As shown in FIG. 14, a cutting opening 180 spanning the mandrel line 120, the trench 30, the filling layer 160, and the gap 20 along the second direction (a Y direction shown in FIG. 14) is formed in the cover layer 170.

The cutting opening 180 is configured to define a dimension and position for cutting the mandrel line 120.

In this form, the cutting opening 180 spans the mandrel line 120, the trench 30, the filling layer 160, and the gap 20. Therefore, there is a low requirement on dimension precision of the cutting opening 180 along the second direction, which is conductive to reducing the difficulty in forming the cutting opening 180 and improving a process window of forming the cutting opening 180.

As shown in FIG. 15, the mandrel line 120 exposed by the cutting opening 180 is removed using the cover layer 170 as a mask, to form the third blocking groove 210 running through the mandrel line 120 along the second direction. The cover layer 170 is removed.

Because there is relatively high etch selectivity between the mandrel line 120 and the base 200 or the filling layer 160, even though the cutting opening 180 further spans the trench 30, the filling layer 160, and the gap 20, the probability that the process of removing the mandrel line 120 exposed by the cutting opening 180 mistakenly etches the base 200 and the filling layer 160 is low.

In this form, the mandrel line 120 exposed by the cutting opening 180 is removed using the anisotropic dry etching process, so as to improve the accuracy of pattern transfer. In this form, the cover layer 170 is removed using at least one of the ashing process or a wet stripping process.

In some other forms, the step of forming the third cutting layer may alternatively include: performing ion doping on a part of the mandrel line after the mandrel line is formed and before the mandrel line is removed, to increase etching resistance of the mandrel line, and using the mandrel line doped with ions as the third cutting layer. The material of the mandrel line includes at least one of amorphous silicon, polysilicon, silicon oxide, amorphous carbon, silicon nitride, amorphous germanium, silicon oxynitride, carbon nitride, silicon carbide, silicon carbonitride, or silicon oxycarbonitride; and ions for performing ion doping on the part of the mandrel line include at least one of boron ions, phosphorus ions, or argon ions. The third cutting layer is formed by performing ion doping on a part of the mandrel line, so that the etching resistance of the third cutting layer is greater than the etching resistance of the mandrel line, and in the step of removing the mandrel line to form the third groove, the mandrel line and the third cutting layer can have relatively high selectivity, which accordingly can retain the third cutting layer to cut the third groove along the first direction. In addition, the steps of performing etching to form the third blocking groove and filling the third cutting layer in the third blocking groove are saved, which is conductive to simplifying processes.

Figure 16:
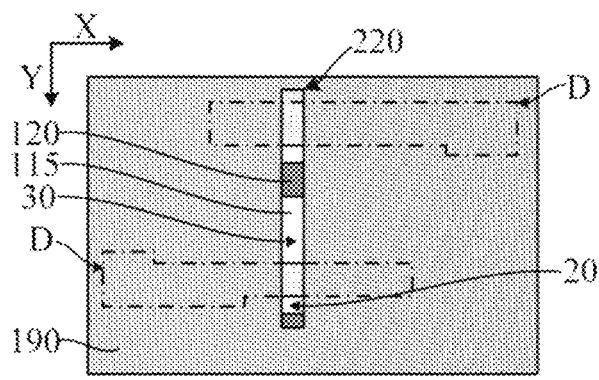
Figure 17:
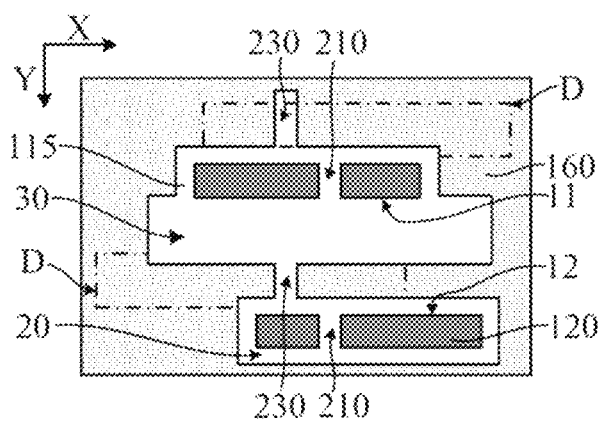

Referring to FIG. 16 and FIG. 17, the forming method further includes: forming a second blocking groove 230 running through the filling layer 160 in the preset area D along the second direction after the filling layer 160 is formed and before the mask spacer is formed.

The second blocking groove 230 is configured to cut the filling layer 160 in the preset area D along the first direction. The second blocking groove 230 further provides space for forming a second cutting layer. Subsequently, after the second cutting layer located in the second blocking groove 230 is formed, and the second groove is formed in the filling layer 160 in a second preset area D, the second groove can be cut by the second cutting layer along the first direction, which is conductive to achieving a smaller distance between second grooves along the first direction.

In this form, the second blocking groove 230 is formed after the sacrificial layer 140 and the sacrificial spacer 130 are removed and before the mask spacer is formed. The second blocking groove 230 is formed before the mask spacer is formed, so that in the step of forming the mask spacer, the mask spacer can be formed in the second blocking groove 230, and mask spacers located in the second blocking groove 230 are in contact with each other. The mask spacers filled in the second blocking groove can be used as the second cutting layer. Therefore, the steps of forming the mask spacer and forming the second cutting layer are integrated accordingly, and the step of forming the third cutting layer additionally is saved, which is conductive to simplifying processes and improving the process integration.

A process sequence of forming the second blocking groove 230 is not limited thereto. In another form, the process sequence of forming the second blocking groove can further be flexibly adjusted according to an actual process.

In one form, the second blocking groove 230 is formed after the third blocking groove 210 is formed. A sequence of forming the second blocking groove 230 and the third blocking groove 210 is not limited thereto.

The specific steps of forming the second blocking groove 230 in this form are described in detail below with reference to the accompanying drawings.

As shown in FIG. 16, a pattern definition layer 190 covering the mandrel line 120 is formed on the filling layer 160. The pattern definition layer 190 is further filled in the gap 20 and the trench 30.

A cutting opening is subsequently formed in the pattern definition layer 190. The remaining pattern definition layer 190 is used as a mask to etch the filling layer 160 to form the second blocking groove.

In this form, a material of the pattern definition layer 190 is SOC.

As shown in FIG. 16, a cutting opening 220 spanning the filling layer 160 in the preset area D, the trench 30, the mandrel line 120, and the gap 20 along the second direction is formed in the pattern definition layer 190. The cutting opening 220 is configured to define a dimension, shape, and position of the second blocking groove.

In this form, the cutting opening 220 spans the filling layer 160 in the preset area D, the trench 30, the mandrel line 120, and the gap 20. Therefore, there is a low requirement on dimension precision of the cutting opening 220 along the second direction, which is conductive to reducing the difficulty in forming the cutting opening 220 and improving a process window of forming the cutting opening 220.

As shown in FIG. 17, the filling layer 160 exposed by the cutting opening 220 is removed using the pattern definition layer 190 as a mask, to form the second blocking groove 230 in the filling layer 160 in the preset area D. The pattern definition layer 190 is removed.

In this form, the filling layer 160 exposed by the cutting opening 220 is removed using the anisotropic dry etching process, which is conductive to improving the accuracy of pattern transfer and control over an etch profile. In this form, the pattern definition layer 190 is removed using at least one of the ashing process or the wet stripping process.

Figure 18:
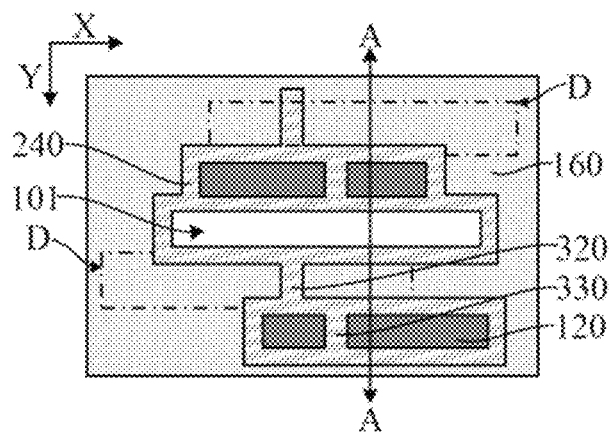
Figure 19:
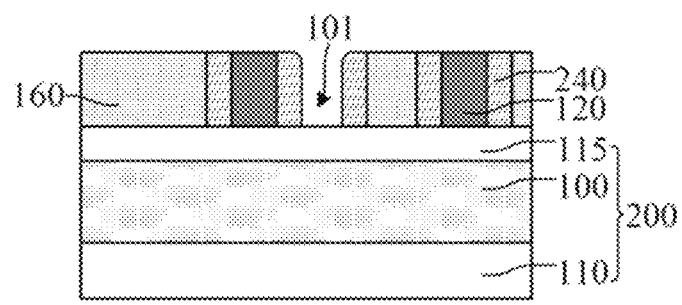

Referring to FIG. 18 and FIG. 19, FIG. 19 is a cross-sectional view along a cutting line A-A in FIG. 18. A mask spacer 240 is formed on the sidewall of the trench 30 and is further filled between the sidewall of the mandrel line 120 and the filling layer 160. The mask spacer 240 located on the sidewall of the trench 30 forms a first groove 101.

The mask spacer 240 is filled in the gap 20.

The mask spacer 240 is configured to be used together with the filling layer 160 and the cutting layer as a mask to pattern the target layer 100.

The mask spacer 240 is further configured to isolate adjacent grooves.

Therefore, in this form, by adjusting the thickness of the mask spacer 240, a designed minimum spacing can be easily met between the adjacent grooves.

The first groove 101 is configured to define a shape and position of the target pattern.

In this form, the thickness of the mask spacer 240 located on the sidewall of the trench 30 is greater than or equal to half of the thickness of the sacrificial spacer 130, so as to ensure that the mask spacer 240 can fully fill the gap 20.

In this form, the thickness of the mask spacer 240 is the same as the thickness of the sacrificial spacer 130. Accordingly, after the second groove and the third groove are formed subsequently, adjacent grooves are equally spaced along the second direction. After the target layer 100 below the first groove 101, the second groove, and the third groove is patterned and the target pattern is formed, parts of the target pattern are also equally spaced along the second direction, so that the uniformity of the target pattern is improved.

In a specific implementation, the thickness of the mask spacer 240 may alternatively be different from the thickness of the sacrificial spacer 130, so that adjacent grooves are spaced differently by adjusting the thicknesses of the mask spacer 240 and the sacrificial spacer 130 according to an actual requirement, and parts of the target pattern are spaced differently.

In this form, the mask spacer 240 is made of a material that has etch selectivity with the mandrel line 120 and the base 200. The material of the mask spacer 240 includes at least one of silicon oxide, silicon nitride, aluminum oxide, aluminum nitride, titanium oxide, titanium nitride, silicon carbide, silicon oxycarbide, or amorphous silicon, and the material of the mask spacer 240 is the same as or different from the material of the sacrificial spacer 130.

In this form, a process of forming the mask spacer 240 includes the atomic layer deposition process, which is conductive to improving the thickness uniformity, gap filling capability, and film formation quality of the mask spacer 240, and precisely controlling the thickness of the mask spacer 240.

In this form, the forming method of a semiconductor structure further includes: forming a second cutting layer 320 (shown in FIG. 18) running through a part of the filling layer 160 in the preset area D along the second direction after the filling layer 160 is formed, where the second cutting layer 320 cuts the filling layer 160 in the preset area D along the first direction.

The second cutting layer 320 is further used as a mask to pattern the target layer 100 subsequently. By forming the second cutting layer 320, after the second groove running though the filling layer 160 in the preset area D is formed, the second groove can be cut by the second cutting layer 320 along the first direction, which is conductive to achieving a smaller distance between second grooves along the first direction.

In this form, the step of forming the second cutting layer 320 includes: In the step of forming the mask spacer 240, the mask spacer 240 is further formed in the second blocking groove 230, and mask spacers 240 in the second blocking groove 230 are in contact with each other. The mask spacers 240 filled in the second blocking groove 230 are used as the second cutting layer 320.

Therefore, in this form, the second cutting layer 320 is formed by mask spacers 240 whose sidewalls are in contact with each other, and a material of the second cutting layer 320 is the same as the material of the mask spacer 240 accordingly.

In this form, the forming method of a semiconductor structure further includes: forming a third cutting layer 330 (shown in FIG. 18) running through the mandrel line 120 along the second direction after the mandrel line 120 is formed and before the mandrel line 120 is removed, where the third cutting layer 330 cuts the mandrel line 120 along the first direction.

The third cutting layer 330 is further used as a mask to pattern the target layer 100 subsequently.

Subsequently, the mandrel line 120 is removed to form the third groove, the third cutting layer 330 is formed accordingly in the third groove, and the third cutting layer 330 cuts the third groove along the first direction, so that a smaller distance can be achieved between third grooves located on two sides of the third cutting layer 330. Accordingly, after the target layer 100 below the third groove is patterned and the target pattern is formed, a smaller distance can also be achieved between adjacent parts of the target pattern at an HTH position.

In this form, the step of forming the third cutting layer 330 includes: In the step of forming the mask spacer 240, the mask spacer 240 is further formed in the third blocking groove 210, and mask spacers 240 in the third blocking groove 210 are in contact with each other. The mask spacers 240 located in the third blocking groove 210 are used as the third cutting layer 330.

Therefore, in this form, the third cutting layer 330 is formed by mask spacers 240 whose sidewalls are in contact with each other, and a material of the third cutting layer 330 is the same as the material of the mask spacer 240 accordingly.

In this form, for example, the mask spacer 240 is filled in the second blocking groove 230 to form the second cutting layer 320 and is further filled in the third blocking groove 210 to form the third cutting layer 330. In another form, the steps of forming the second cutting layer and forming the third cutting layer may further include other steps.

Referring to FIG. 20 to FIG. 24, in this form, after the first groove 101 is formed and before the second groove is formed and the mandrel line is removed, the forming method of a semiconductor structure further includes: forming a first cutting layer 310 in the first groove 101.

The first cutting layer 310 is further used as a mask to pattern the target layer 100 subsequently.

The first cutting layer 310 is configured to cut the first groove 101 along the first direction, so that a smaller distance can be achieved between adjacent first grooves 101 along the first direction. After the target layer 100 below the first groove 101 is patterned and the target pattern is formed, a smaller distance can also be achieved between adjacent parts of the target pattern at an HTH position, which is conductive to improving the flexibility and freedom of layout design of the target pattern, and meeting a requirement for a decreasing pitch in an IC.

The first cutting layer 310 is made of a material that has etch selectivity with the mandrel line 120 and the base 200. The material of the first cutting layer 310 includes at least one of silicon oxide, silicon nitride, aluminum oxide, aluminum nitride, titanium oxide, titanium nitride, silicon carbide, silicon oxycarbide, or amorphous silicon.

The specific steps of forming the first cutting layer 310 in this form are described in detail below with reference to the accompanying drawings.

Figure 20:
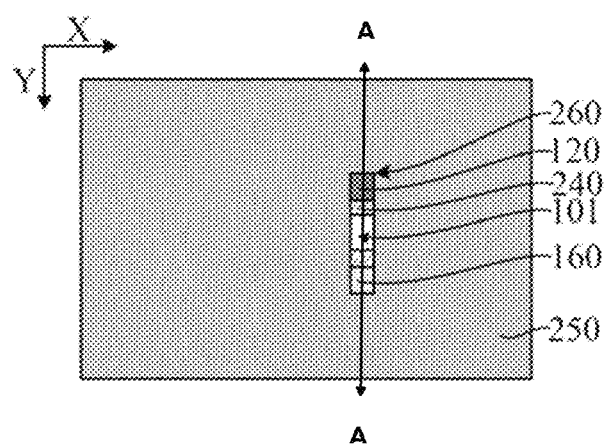
Figure 21:
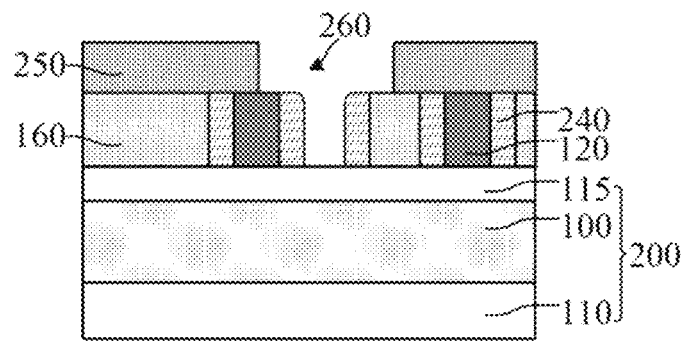

Refer to FIG. 20 and FIG. 21. FIG. 21 is a cross-sectional view along a cutting line A-A in FIG. 20, a support layer 250 covering the mask spacer 240, the mandrel line 120, and the first groove 101 is formed on the filling layer 160.

The support layer 250 is configured to form the first blocking groove subsequently. After the first blocking groove is formed, the support layer 250 provides support for forming the first cutting layer in the first blocking groove.

After the first cutting layer is formed, the support layer 250 is removed. Therefore, the support layer 250 is made of a material that can be easily removed, to reduce the difficulty in removing the support layer 250. In this form, the material of the support layer 250 is SOC. The SOC is suitable for the spin-on process, which is conductive to reducing the difficulty in forming the support layer 250 and improving the flatness of a top surface of the support layer 250. The SOC is also easy to remove.

In another form, the material of the support layer may alternatively include at least one of an organic dielectric layer (ODL), a BARC, a silicon anti-reflective coating (Si-ARC), deep UV light absorbing oxide (DUO), a dielectric anti-reflective coating (DARC), or an advanced patterning film (APF). In this form, the support layer 250 is formed by using the spin-on process.

As shown in FIG. 20 and FIG. 21, the first blocking groove 260 that extends along the second direction and spans the first groove 101 is formed in the support layer 250.

The first blocking groove 260 is configured to define a dimension, shape, and position of the first cutting layer. In this form, the first blocking groove 260 further spans adjacent mask spacers 240, the mandrel line 120, and the filling layer 160 along the second direction, which is conductive to reducing a requirement on dimension precision of the first blocking groove 260 along the second direction.

Figure 22:
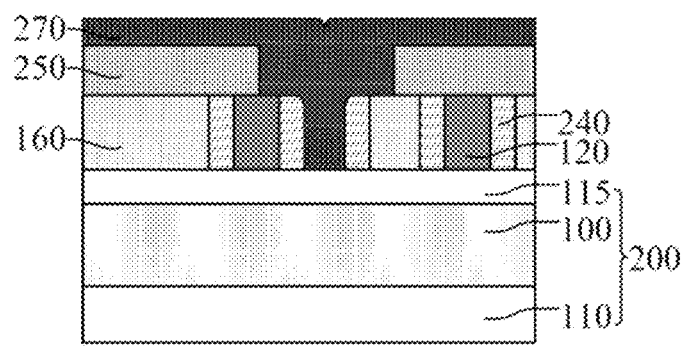
Figure 23:
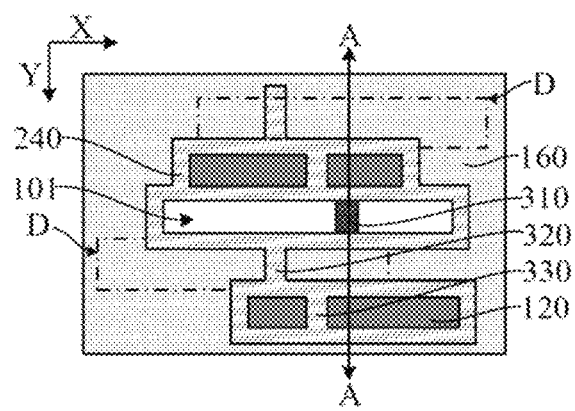
Figure 24:
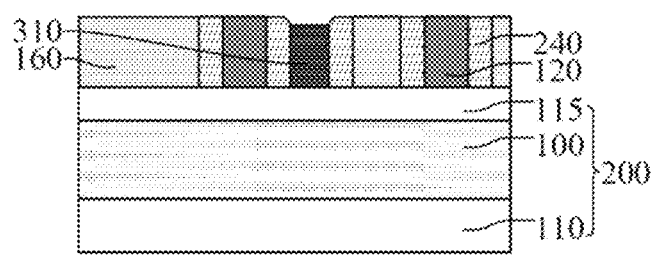

As shown in FIG. 22 to FIG. 24, the first cutting layer 310 is formed in the first blocking groove 260.

In this form, the step of forming the first cutting layer 310 in the first blocking groove 260 includes: As shown in FIG. 22, a cutting material layer 270 is filled in the first blocking groove 260, where the cutting material layer 270 further covers the support layer 250. Refer to FIG. 23 and FIG. 24. FIG. 24 is a cross-sectional view along a cutting line A-A in FIG. 23. The cutting material layer 270 located on the support layer 250, the mask spacer 240, the mandrel line 120, and the filling layer 160 is removed, and a part of the cutting material layer 270 located in the first blocking groove 260 is retained as the first cutting layer 310.

In one form, the cutting material layer 270 is formed using the chemical vapor deposition process or the atomic layer deposition process. In the step of forming the cutting material layer 270, as the deposition thickness increases, cutting material layers 270 located in the first blocking groove 260 are in contact with each other gradually, so as to fill the first blocking groove 260.

In this form, the cutting material layer 270 located on the support layer 250, the mask spacer 240, the mandrel line 120, and the filling layer 160 is removed using the dry etching process (for example, the anisotropic dry etching process).

Forms of the forming method of a semiconductor structure further include: removing the support layer 250 for subsequent procedures. The process of removing the support layer 250 includes at least one of the ashing process or the wet stripping process.

Figure 25:
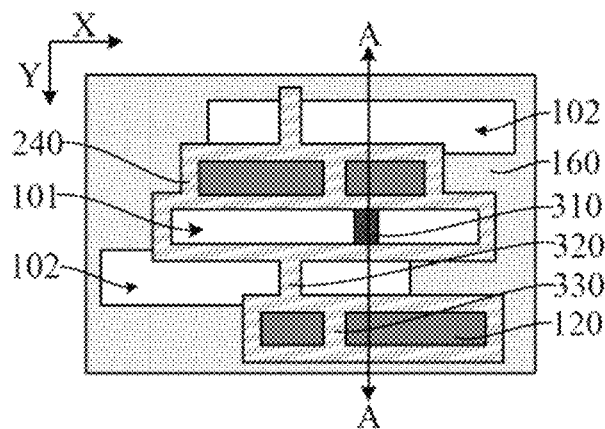
Figure 26:
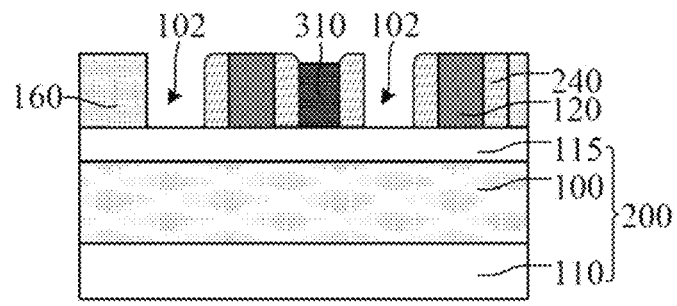

Referring to FIG. 25 and FIG. 26, FIG. 26 is a cross-sectional view along a cutting line A-A in FIG. 25. A second groove 102 is formed and runs through the filling layer 160 between the sidewall of the trench 30 and the mask spacer 240 located on the second sidewall 12. The second groove 102 is configured to define the shape and position of the target pattern.

In this form, in the step of forming the second groove 102, the mask spacer 240 can further define an etch stop position along the second direction, so that the etching process of forming the second groove 102 can implement self-overlay according to a position of the mask spacer 240, a process window of forming the second groove 102 is accordingly improved, and the second groove 102 can be isolated from the first groove 101 and the mandrel line 120 by the mask spacer 240.

In this form, after the second groove 102 is formed, the second cutting layer 320 is formed in the second groove 102. The second cutting layer 320 cuts the second groove 102 along the first direction, so that a smaller distance can be achieved between second grooves 120 at a position of the second cutting layer 320.

Figure 27:
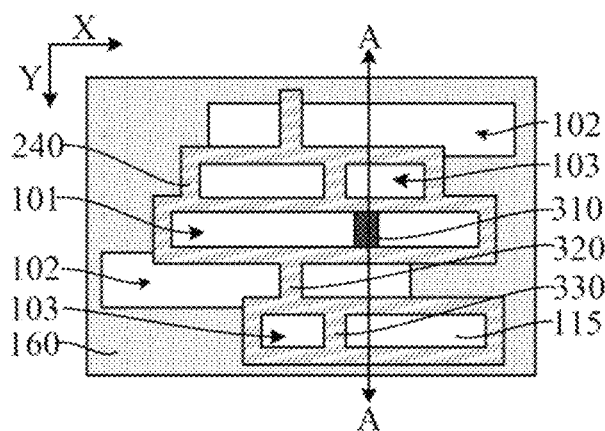
Figure 28:
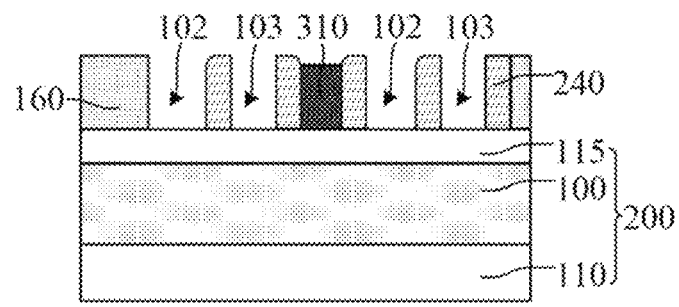

Referring to FIG. 27 and FIG. 28, FIG. 28 is a cross-sectional view along a cutting line A-A in FIG. 27. The mandrel line 120 is removed, to form a third groove 103. A cutting layer is formed in at least one of the third groove 103, the second groove 102, and the first groove 101, and the cutting layer cuts the corresponding groove along the first direction.

The third groove 103 is configured to define the shape and position of the target pattern together with the second groove 102 and the first groove 101. In this form, a shape and position of the first groove 101 are defined using the sacrificial layer 140 and the mask spacer 240, a shape and position of the second groove 102 are defined using the mandrel line 120, and the second groove 102 is formed in different steps, which is conductive to reducing the difficulty in forming the first groove 101, the second groove 102, and the third groove 103, improving a process window (for example, mitigating the optical proximity effect, and relieving the limitation to the resolution of the photolithography process), and improving the accuracy of pattern transfer, so as to ensure the pattern precision of the first groove 101, the second groove 102, and the third groove 103.

A cutting layer is formed in at least one of the third groove 103, the second groove 102, and the first groove 101, and the cutting layer cuts the corresponding groove along the first direction, so that a smaller distance can be achieved between corresponding grooves located on two sides of the cutting layer. Accordingly, after the target layer below the third groove 103, the second groove 102, and the first groove 101 is patterned and the target pattern is formed, a smaller distance can also be achieved between adjacent parts of the target pattern at an HTH position, which is conductive to improving the flexibility and freedom of layout design of the target pattern, and meeting a requirement for a decreasing pitch in an IC.

In this form, the third groove 103, the second groove 102, and the first groove 101 all extend along the first direction, and are arranged at intervals along the second direction, and adjacent grooves are isolated from each other by the mask spacer 240, which is conductive to meeting a designed minimum spacing between adjacent grooves. Accordingly, after the target layer 100 below the third groove 103, the second groove 102, and the first groove 101 is patterned and the target pattern is formed, a designed minimum spacing can be easily met between adjacent parts of the target pattern.

A process of removing the mandrel line 120 includes one or two processes of wet etching and dry etching.

In this form, the mandrel line 120 is removed using the wet etching process. In this form, an etching solution in the wet etching process includes a tetramethylammonium hydroxide (TMAH) solution, an SC1 solution or an SC2 solution. The SC1 solution refers to a mixed solution of $NH_4OH$ and $H_2O_2$, and the SC2 solution refers to a mixed solution of HCl and $H_2O_2$.

Specifically, in this form, the first cutting layer 310 is formed in the first groove 101, and the first cutting layer 310 cuts the first groove 101 along the first direction. The second cutting layer 320 is formed in the second groove 102, and the second cutting layer 320 cuts the second groove 102 along the first direction. The third cutting layer 330 is formed in the third groove 103, and the third cutting layer 330 cuts the third groove 103 along the first direction.

It is to be noted that the positions and quantities of the cutting layers are merely used as an example. In an actual process, the positions and quantities of the cutting layers may further be adjusted according to an actual process requirement. For example, a cutting layer may not be disposed in a groove, or a plurality of cutting layers may be disposed in the same groove.

Figure 29:
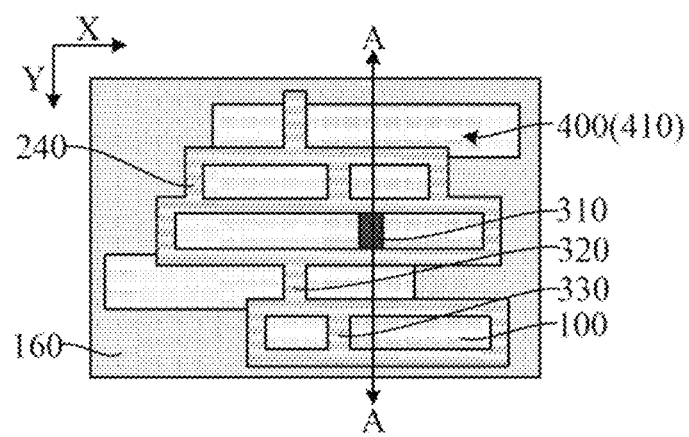
Figure 30:
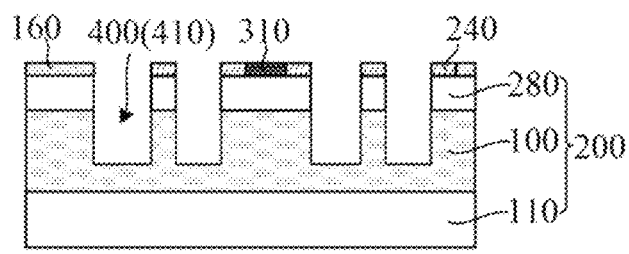

Refer to FIG. 29 and FIG. 30, FIG. 30 is a cross-sectional view along a cutting line A-A in FIG. 29. The target layer 100 below the third groove 103, the second groove 102, and the first groove 101 is patterned using the cutting layer, the mask spacer 240, and the filling layer 160 as a mask, to form a target pattern 400.

As can be learned from the above, the first groove 101, the second groove 102, and the third groove 103 have high flexibility and freedom in pattern design, the pattern precision of the first groove 101, the second groove 102, and the third groove 103 can be ensured, and a designed minimum spacing can be easily met between adjacent grooves. After the target layer 100 below the first groove 101, the second groove 102, and the third groove 103 is patterned and the target pattern 400 is formed, the pattern quality and pattern precision of the target pattern 400 can be ensured accordingly, and a designed minimum spacing can be easily met between adjacent parts of the target pattern 400 along the second direction.

In addition, a smaller distance can be achieved between corresponding grooves located on two sides of the cutting layer. Accordingly, after the target pattern 400 is formed, a smaller distance can also be achieved between adjacent parts of the target pattern 400 at an HTH position, which is conductive to improving the flexibility and freedom of layout design of the target pattern 400, and meeting a requirement for a decreasing pitch in an IC.

In this form, the target layer 100 is a dielectric layer. The dielectric layer below the first groove 101, the second groove 102, and the third groove 103 is patterned to form an interconnect trench 410. Accordingly, the target pattern 400 is the interconnect trench 410. The interconnect trench 410 provides space for forming an interconnect line.

Specifically, in this form, the HM material layer 115 below the first groove 101, the second groove 102, and the third groove 103 is patterned using the mask spacer 240, the cutting layer, and the filling layer 160 as a mask, to form an HM layer 280. The dielectric layer is patterned by using the HM layer 280 as a mask to form the interconnect trench 410.

Figure 31:
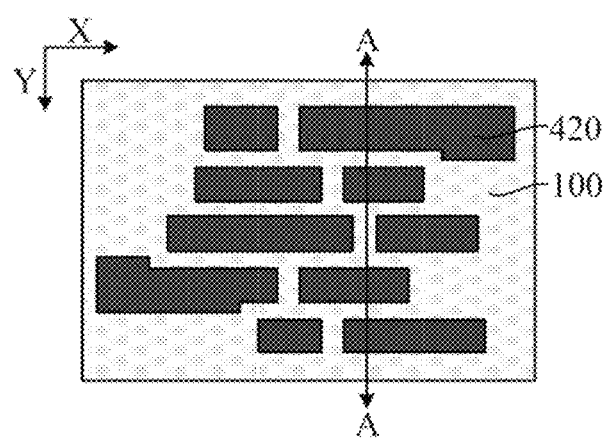
Figure 32:
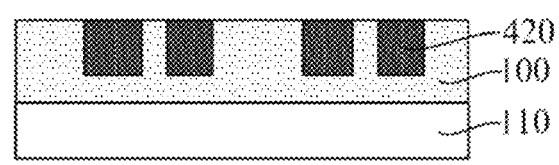

Refer to FIG. 31 and FIG. 32, FIG. 32 is a cross-sectional view along a cutting line A-A in FIG. 31. The forming method further includes: forming an interconnect line 420 in the interconnect trench 410 after the interconnect trench 410 is formed.

In this form, a smaller distance can be achieved for the interconnect trench 410 at an HTH position, and accordingly, a smaller distance can also be achieved for the interconnect line 420 at an HTH position, which is conductive to improving the connectivity of the interconnect line 420 at the HTH position, and improving the freedom and flexibility of layout design of the interconnect line 420. In addition, a spacing between adjacent interconnect trenches 410 along the second direction can easily meet a designed minimum spacing, and the interconnect trench 410 has relatively high pattern precision, which is accordingly conductive to meeting a designed minimum spacing between interconnect lines 420 along the second direction, improving the pattern precision of the interconnect line 420, and improving the performance of the semiconductor structure.

The interconnect line 420 is configured to implement electrical connection between the semiconductor structure and an external circuit or other interconnect structures. In this form, a material of the interconnect line 420 is copper. In another form, the material of the interconnect line may alternatively be a conductive material such as cobalt, tungsten, or aluminum. In this form, in the step of forming the interconnect line 420, the filling layer 160, the mask spacer 240, the cutting layer, and the HM layer 280 are removed for subsequent procedures.

Correspondingly, the present disclosure further provides a semiconductor structure. Referring to FIG. 25 and FIG. 26, FIG. 26 is a cross-sectional view along a cutting line A-A in FIG. 25, and shows a schematic structural diagram of one form of the semiconductor structure according to the present disclosure.

The semiconductor structure includes: a base 200, including a target layer 100 configured to form a target pattern; mandrel lines 120, located on the base 200, where the mandrel lines 120 extend along a first direction (an X direction shown in FIG. 25) and are arranged at intervals along a second direction (a Y direction shown in FIG. 25), the second direction is perpendicular to the first direction, and opposite sidewalls of adjacent mandrel lines 120 in the second direction are a first sidewall 11 (shown in FIG. 17) and a second sidewall (shown in FIG. 17) 12; a filling layer 160, located on the base 200 exposed by the mandrel lines 120, where a trench 30 (shown in FIG. 17) running through a part of the filling layer 160 is formed between adjacent mandrel lines 120 in the second direction, and the trench 30 exposes the first sidewall 11 and is spaced apart from the second sidewall 12; a mask spacer 240, located on a sidewall of the trench 30 and between a sidewall of the mandrel line 120 and the filling layer 160, where the mask spacer 240 located on the sidewall of the trench 30 forms a first groove 101; a second groove 102, running though the filling layer 160 between the first groove 101 and the mask spacer 240 located on the second sidewall 12, where the mandrel line 120 is configured to occupy space for forming a third groove; and a cutting layer, running through at least one of the mandrel line 120, the second groove 102, and the first groove 101 along the second direction, where the cutting layer is configured to cut the corresponding groove along the first direction.

The mandrel line 120 occupies space for forming the third groove, and accordingly, the mandrel line 120 defines a shape and position of the third groove. A shape and position of the first groove 101 are defined using the trench 30 and the mask spacer 240. The second groove 102 runs through the filling layer 160 between the first groove 101 and the mask spacer 240 located on the second sidewall 12. Therefore, in this form, the shapes and positions of the third groove and the first groove 101 are correspondingly defined using the mandrel line 120, and the trench 30 and the mask spacer 240 respectively, and the second groove 102 is formed in different steps, which is conductive to reducing the difficulty in forming the first groove 101, the second groove 102, and the third groove, improving a process window (for example, mitigating the optical proximity effect, and relieving the limitation to the resolution of the photolithography process), and improving the freedom and flexibility of pattern design of the first groove 101, the second groove 102, and the third groove, so as to ensure the pattern precision of the first groove 101, the second groove 102, and the third groove. Further, adjacent grooves are isolated from each other by the mask spacer 240, which is conductive to achieving a designed minimum spacing between adjacent grooves and accordingly achieving a designed minimum spacing between adjacent parts of the target pattern.

In this form, the semiconductor structure further includes the cutting layer. The cutting layer runs through at least one of the mandrel line 120, the second groove 102, and the first groove 101 along the second direction, and is configured to cut the corresponding groove along the first direction, so that a smaller distance can be achieved between corresponding grooves located on two sides of the cutting layer. Accordingly, after the target layer below the third groove, the second groove 102, and the first groove 101 is patterned and the target pattern is formed, a smaller distance can also be achieved between adjacent parts of the target pattern at an HTH position, which is conductive to improving the flexibility and freedom of layout design of the target pattern, and meeting a requirement for a decreasing pitch in an IC.

The base 200 is configured to provide a platform for a manufacturing process. The target layer 100 is a film layer to be patterned to form the target pattern. The target pattern may be a pattern such as a gate structure, an interconnect trench in a BEOL, a fin in a FinFET, a channel stack in a GAA transistor or a Forksheet transistor, or an HM layer.

In this form, the target layer 100 is a dielectric layer. Subsequently, the dielectric layer is patterned to form a plurality of interconnect trenches in the dielectric layer, and then interconnect lines are formed in the interconnect trenches. The dielectric layer is configured to implement electrical isolation between adjacent interconnect lines. Accordingly, in this form, the target pattern is an interconnect trench, and the dielectric layer is an IMD layer.

In this form, semiconductor devices such as a transistor and a capacitor may be formed in the base 200, and functional structures such as a resistance structure and a conductive structure may also be formed in the base 200. In this form, the base 200 further includes a substrate 110 located below the target layer 100. In an example, the substrate 110 is a silicon substrate.

In this form, the base 200 further includes an HM material layer 115 above the target layer 100. Subsequently, the HM material layer 115 is patterned first to form an HM layer, and the target layer 100 is then patterned by using the HM layer as a mask, which is conductive to improving the process stability of patterning the target layer 100 and the accuracy of pattern transfer.

The mandrel line 120 is configured to occupy space for forming the third groove.

In this form, the mandrel line 120 is a material that can be easily removed, thereby reducing the difficulty in a subsequent process of removing the mandrel line 120 to form the third groove. The mandrel line 120 is a single-layer structure or a multi-layer structure. The material of the mandrel line 120 includes at least one of amorphous silicon, polysilicon, silicon oxide, amorphous carbon, silicon nitride, amorphous germanium, silicon oxynitride, carbon nitride, silicon carbide, silicon carbonitride, or silicon oxycarbonitride.

In an example, the mandrel line 120 is a single-layer structure and the material of the mandrel line 120 is amorphous silicon.

The filling layer 160 is used together with the mask spacer 240 and the cutting layer as a mask to pattern the target layer 100. A material of the filling layer 160 includes spin-on silicon oxide, metal oxide (such as titanium oxide), polysilicon, and amorphous silicon. In this form, the material of the filling layer 160 is spin-on silicon oxide.

The sidewall of the trench 30 provides support for forming the mask spacer 240. Accordingly, the trench 30 and the mask spacer 240 located on the sidewall of the trench 30 are configured to define the shape and position of the first groove 101.

The trench 30 exposes the first sidewall 11 of the mandrel line 120, so that a spacing between the first groove 101 and the first sidewall 11 is accordingly the thickness of the mask spacer 240, and a spacing between the first groove 101 and the third groove is accordingly the thickness of the mask spacer 240 as well, which is conductive to meeting a designed minimum spacing between the first groove 101 and the third groove.

The mask spacer 240 is used together with the filling layer 160 and the cutting layer as a mask to pattern the target layer 100. The mask spacer 240 is further configured to isolate adjacent grooves. Therefore, in this form, by adjusting the thickness of the mask spacer 240, a designed minimum spacing can be easily met between the adjacent grooves.

In this form, the mask spacer 240 is made of a material that has etch selectivity with the mandrel line 120 and the base 200. The material of the mask spacer 240 includes at least one of silicon oxide, silicon nitride, aluminum oxide, aluminum nitride, titanium oxide, titanium nitride, silicon carbide, silicon oxycarbide, or amorphous silicon.

The first groove 101 is configured to define a shape and position of the target pattern.

The second groove 102 is configured to define the shape and position of the target pattern.

The first groove 101 and the second groove 102 extend along a first direction and are arranged along the second direction.

The cutting layer is configured to cut the corresponding groove along the first direction, so that a smaller distance can be achieved for the corresponding groove at a position of the cutting layer.

In this form, the cutting layer includes a first cutting layer 310 in the first groove 101, and the first cutting layer 310 cuts the first groove 101 along the first direction.

The first cutting layer 310 is further used as a mask to pattern the target layer 100 subsequently.

The first cutting layer 310 is configured to cut the first groove 101 along the first direction, so that a smaller distance can be achieved between adjacent first grooves 101 along the first direction. After the target layer 100 below the first groove 101 is patterned and the target pattern is formed, a smaller distance can also be achieved between adjacent parts of the target pattern at an HTH position, which is conductive to improving the flexibility and freedom of layout design of the target pattern, and meeting a requirement for a decreasing pitch in an IC.

The first cutting layer 310 is made of a material that has etch selectivity with the mandrel line 120 and the base 200. The material of the first cutting layer 310 includes at least one of silicon oxide, silicon nitride, aluminum oxide, aluminum nitride, titanium oxide, titanium nitride, silicon carbide, silicon oxycarbide, or amorphous silicon.

In this form, the cutting layer includes a second cutting layer 320 in the second groove 102, and the second cutting layer 320 cuts the second groove 102 along the first direction.

The second cutting layer 320 is further used as a mask to pattern the target layer 100 subsequently. The second groove 102 is cut by the second cutting layer 320 along the first direction, which is conductive to achieving a smaller distance between second grooves 102 along the first direction.

Therefore, in this form, the second cutting layer 320 is formed by mask spacers 240 whose sidewalls are in contact with each other, and a material of the second cutting layer 320 is the same as the material of the mask spacer 240 accordingly. The second cutting layer 320 is formed by the mask spacers 240 whose sidewalls are in contact with each other, because the step of forming the second cutting layer 320 includes: forming a second blocking groove in the filling layer 160 after the filling layer 160 is formed and before the mask spacer 240 is formed; and in the step of forming the mask spacer 240, the mask spacer 240 is formed in the second blocking groove, and the mask spacers 240 in the second blocking groove are in contact with each other and used as the second cutting layer 320.

In this form, the cutting layer includes a third cutting layer 330 running through the mandrel line 120 along the second direction, and the third cutting layer 330 cuts the mandrel line 120 along the first direction.

The third cutting layer 330 is further used as a mask to pattern the target layer 100 subsequently.

Subsequently, the mandrel line 120 is removed to form the third groove, the third cutting layer 330 is formed accordingly in the third groove, and the third cutting layer 330 cuts the third groove along the first direction, so that a smaller distance can be achieved between third grooves located on two sides of the third cutting layer 330. Accordingly, after the target layer 100 below the third groove, the second groove, and the first groove is patterned and the target pattern is formed, a smaller distance can also be achieved between adjacent parts of the target pattern at an HTH position.

In this form, a third blocking groove 210 (shown in FIG. 17) running through the mandrel line 120 along the second direction is formed in the mandrel line 120, the mask spacer 240 is located in the third blocking groove 210, and the mask spacers 240 in the third blocking groove 210 are in contact with each other and used as a third cutting layer 330. Therefore, in this form, a material of the third cutting layer 330 is the same as the material of the mask spacer 240.

In another form, the material of the third cutting layer is the same as the material of the mandrel line, and the third cutting layer includes doped ions, where the doped ions are adapted to enable etching resistance of the third cutting layer to be greater than etching resistance of the mandrel line. The third cutting layer includes the doped ions that improve etching resistance. Therefore, the etching resistance of the third cutting layer is greater than the etching resistance of the mandrel line. In the subsequent step of removing the mandrel line to form the third groove, the mandrel line and the third cutting layer are subject to relatively high selectivity, so that the third cutting layer can be retained to cut the third groove. The material of the third cutting layer includes at least one of silicon oxide, silicon nitride, aluminum oxide, aluminum nitride, titanium oxide, titanium nitride, silicon carbide, silicon oxycarbide, or amorphous silicon. The doped ions include at least one of boron ions, phosphorus ions, or argon ions.

It is to be noted that the positions and quantities of the cutting layers are merely used as an example. In an actual process, the positions and quantities of the cutting layers may be flexibly adjusted according to an actual process requirement. For example, a cutting layer may not be disposed in a groove, or a plurality of cutting layers may be disposed in the same groove.

The semiconductor structure may be formed using the forming method described in the foregoing forms, or may be formed by using other forming methods. For detailed descriptions of the semiconductor structure in this form, reference may be made to corresponding descriptions in the foregoing forms as details are not described again.

Although the present disclosure is described above, the present disclosure is not limited thereto. A person skilled in the art may make variations and modifications without departing from the spirit and scope of the present disclosure. Therefore, the protection scope of the present disclosure should be subject to the claims.

What is claimed is:

1. A forming method of a semiconductor structure, comprising:
providing a base, comprising a target layer configured to form a target pattern;
forming mandrel lines that extend along a first direction and are arranged at intervals along a second direction on the base, wherein the second direction is perpendicular to the first direction, and wherein opposite sidewalls of adjacent mandrel lines in the second direction are a first sidewall and a second sidewall;
forming a sacrificial spacer on a sidewall of the mandrel line;
after forming the sacrificial spacer, forming a sacrificial layer extending along the first direction on a part of the base between adjacent sacrificial spacers, wherein the sacrificial layer covers a sidewall of a sacrificial spacer located on the first sidewall, and is spaced apart from a sacrificial spacer located on the second sidewall;
forming a filling layer on the base exposed by the mandrel line, the sacrificial spacer, and the sacrificial layer;
removing the sacrificial layer, to form an opening in the filling layer;

removing the sacrificial spacer, wherein the opening and the first sidewall form a trench;

forming a mask spacer on a sidewall of the trench, wherein the mask spacer is further filled between the sidewall of the mandrel line and the filling layer, and the mask spacer located on the sidewall of the trench forms a first groove;

forming a second groove running through the filling layer between the sidewall of the trench and the mask spacer located on the second sidewall;

performing ion doping on a part of the mandrel line to increase etching resistance of the mandrel line, and using the part of mandrel line doped with ions as a third cutting layer cutting the mandrel line along the first direction;

removing the mandrel line, to form a third groove, wherein a cutting layer is formed in at least one of the third groove, the second groove, and the first groove, and the cutting layer cuts the corresponding groove along the first direction; and patterning the target layer below the third groove, the second groove, and the first groove using the cutting layer, the mask spacer, and the filling layer as a mask, to form the target pattern.

2. The forming method of a semiconductor structure according to claim 1, wherein:
a first cutting layer is formed in the first groove; and
the first cutting layer is formed in the first groove after the first groove is formed and before the second groove is formed and the mandrel line is removed.

3. The forming method of a semiconductor structure according to claim 2, wherein the step of forming the first cutting layer comprises:
forming, on the filling layer, a support layer covering the mask spacer, the mandrel line, and the first groove;
forming, in the support layer, a first blocking groove that extends along the second direction and spans the first groove;
forming the first cutting layer in the first blocking groove; and
removing the support layer.

4. The forming method of a semiconductor structure according to claim 3, wherein:
the first blocking groove further spans adjacent mask spacers, the mandrel line, and the filling layer along the second direction; and
the step of forming the first cutting layer in the first blocking groove comprises:
filling a cutting material layer in the first blocking groove, wherein the cutting material layer further covers the support layer; and
removing the cutting material layer located on the support layer, the mask spacer, the mandrel line, and the filling layer, and retaining a part of the cutting material layer located in the first blocking groove as the first cutting layer.

5. The forming method of a semiconductor structure according to claim 1, wherein:
a second cutting layer is formed in the second groove;
in the step of forming the filling layer, the filling layer comprises a preset area located between a sidewall of the sacrificial layer and the sacrificial spacer located on the second sidewall, to form the second groove; and
the second cutting layer running through a part of the filling layer in the preset area along the second direction is formed after the filling layer is formed and before the second groove is formed, wherein the second cutting layer cuts the filling layer in the preset area along the first direction.

6. The forming method of a semiconductor structure according to claim 5, further comprising:
forming a second blocking groove running through the filling layer in the preset area along the second direction after the filling layer is formed and before the mask spacer is formed,
wherein the step of forming the second cutting layer comprises: in the step of forming the mask spacer, mask spacers located in the second blocking groove are in contact with each other, and the mask spacers filled in the second blocking groove are used as the second cutting layer.

7. The forming method of a semiconductor structure according to claim 6, wherein:
the second blocking groove is formed after the sacrificial layer and the sacrificial spacer are removed and before the mask spacer is formed;
in the step of removing the sacrificial layer, a gap is formed between the sidewall of the mandrel line and the filling layer; and
the step of forming the second blocking groove comprises:
forming, on the filling layer, a pattern definition layer covering the mandrel line, wherein the pattern definition layer is further filled in the gap and the trench;
forming, in the pattern definition layer, a cutting opening spanning the filling layer in the preset area, the trench, the mandrel line, and the gap along the second direction;
removing, using the pattern definition layer as a mask, the filling layer exposed by the cutting opening, and forming the second blocking groove in the filling layer in the preset area; and
removing the pattern definition layer.

8. The forming method of a semiconductor structure according to claim 1, wherein:
a material of the mandrel line comprises at least one of amorphous silicon, polysilicon, silicon oxide, amorphous carbon, silicon nitride, amorphous germanium, silicon oxynitride, carbon nitride, silicon carbide, silicon carbonitride, or silicon oxycarbonitride; and
ions for performing ion doping on the part of the mandrel line comprise at least one of boron ions, phosphorus ions, or argon ions.

9. The forming method of the semiconductor structure according to claim 1, wherein:
the target layer is a dielectric layer, and the target pattern is an interconnect trench; and
the forming method of a semiconductor structure further comprises: forming an interconnect line in the interconnect trench after the interconnect trench is formed.

10. A forming method of a semiconductor structure, comprising:
providing a base, comprising a target layer configured to form a target pattern;
forming mandrel lines that extend along a first direction and are arranged at intervals along a second direction on the base, wherein the second direction is perpendicular to the first direction, and wherein opposite sidewalls of adjacent mandrel lines in the second direction are a first sidewall and a second sidewall;
forming a sacrificial spacer on a sidewall of the mandrel line;

after forming the sacrificial spacer, forming a sacrificial layer extending along the first direction on a part of the base between adjacent sacrificial spacers, wherein the sacrificial layer covers a sidewall of a sacrificial spacer located on the first sidewall, and is spaced apart from a sacrificial spacer located on the second sidewall;

forming a filling layer on the base exposed by the mandrel line, the sacrificial spacer, and the sacrificial layer;

removing the sacrificial layer, to form an opening in the filling layer;

removing the sacrificial spacer, wherein the opening and the first sidewall form a trench;

forming a third blocking groove running through the mandrel line along the second direction;

forming a mask spacer on a sidewall of the trench, wherein the mask spacer is further filled between the sidewall of the mandrel line and the filling layer, and the mask spacer located on the sidewall of the trench forms a first groove, mask spacers located in the third blocking groove are in contact with each other, and the mask spacers located in the third blocking groove are used as a third cutting layer cutting the mandrel line along the first direction;

forming a second groove running through the filling layer between the sidewall of the trench and the mask spacer located on the second sidewall;

removing the mandrel line, to form a third groove, wherein a cutting layer is formed in at least one of the third groove, the second groove, and the first groove, and the cutting layer cuts the corresponding groove along the first direction; and patterning the target layer below the third groove, the second groove, and the first groove using the cutting layer, the mask spacer, and the filling layer as a mask, to form the target pattern.

11. The forming method of a semiconductor structure according to claim 10, wherein:

the third blocking groove is formed after the sacrificial layer and the sacrificial spacer are removed and before the mask spacer is formed;

in the step of removing the sacrificial layer, a gap is formed between the sidewall of the mandrel line and the filling layer; and the step of forming the third blocking groove comprises:

forming, on the filling layer, a cover layer covering the mandrel line, wherein the cover layer is further filled in the gap and the trench;

forming, in the cover layer, a cutting opening spanning the mandrel line, the trench, the filling layer, and the gap along the second direction; and removing, using the cover layer as a mask, the mandrel line exposed by the cutting opening, and forming the third blocking groove running through the mandrel line along the second direction.

12. A semiconductor structure, comprising:

a base, comprising a target layer configured to form a target pattern;

mandrel lines, located on the base, wherein the mandrel lines extend along a first direction and are arranged at intervals along a second direction, wherein the second direction is perpendicular to the first direction, and opposite sidewalls of adjacent mandrel lines in the second direction are a first sidewall and a second sidewall, a part of the mandrel line is doped with ion and used as a third cutting layer configured to cut the mandrel line along the first direction;

a filling layer, located on the base exposed by the mandrel lines, wherein a trench running through a part of the filling layer is formed between adjacent mandrel lines in the second direction, and the trench exposes the first sidewall and is spaced apart from the second sidewall;

a mask spacer, located on a sidewall of the trench and between a sidewall of the mandrel line and the filling layer, wherein the mask spacer located on the sidewall of the trench forms a first groove, and the first groove is spaced apart from the mandrel lines by the mask spacer;

a second groove, running though the filling layer between the first groove and the mask spacer located on the second sidewall, wherein the mandrel line is configured to occupy space for forming a third groove; and a cutting layer, running through at least one of the mandrel line, the second groove, and the first groove along the second direction, wherein the cutting layer is configured to cut the corresponding groove along the first direction.

13. The semiconductor structure according to claim 12, wherein the cutting layer comprises a first cutting layer located in the first groove, and the first cutting layer cuts the first groove along the first direction.

14. The semiconductor structure according to claim 12, wherein the cutting layer comprises a second cutting layer located in the second groove, and the second cutting layer cuts the second groove along the first direction.

15. The semiconductor structure according to claim 14, wherein the second cutting layer is formed by mask spacers whose sidewalls are in contact with each other.

16. The semiconductor structure according to claim 12, wherein:

the doped ion is adapted to increase etching resistance of the part of the mandrel line.

17. The semiconductor structure according to claim 16, wherein:

a material of the mandrel line comprises at least one of silicon oxide, silicon nitride, aluminum oxide, aluminum nitride, titanium oxide, titanium nitride, silicon carbide, silicon oxycarbide, or amorphous silicon; and the doped ion comprises at least one of boron ions, phosphorus ions, or argon ions.

18. The semiconductor structure according to claim 12, wherein the target layer is a dielectric layer, and the target pattern is an interconnect trench.

* * * * *